United States Patent [19]

Fujioka

[11] Patent Number: 5,742,554
[45] Date of Patent: Apr. 21, 1998

[54] VOLATILE MEMORY DEVICE AND METHOD OF REFRESHING SAME

[75] Inventor: Shinya Fujioka, Kawasaki, Japan

[73] Assignee: Fujitsu Limited, Kawasaki, Japan

[21] Appl. No.: 685,859

[22] Filed: Jul. 24, 1996

[30] Foreign Application Priority Data

Dec. 25, 1996 [JP] Japan .................................. 7-336712

[51] Int. Cl.⁶ .................................. G11C 7/00; G11C 8/00
[52] U.S. Cl. .............. 365/222; 365/230.03; 365/230.06; 365/230.08
[58] Field of Search ................. 365/189.05, 222, 365/230.03, 230.06, 23.08

[56] References Cited

U.S. PATENT DOCUMENTS

| | | | |
|---|---|---|---|
| 4,984,210 | 1/1991 | Kumanoya et al. | 365/222 |
| 5,251,176 | 10/1993 | Komatsu | 365/222 |
| 5,402,384 | 3/1995 | Fujisawa | 365/222 |
| 5,450,364 | 9/1995 | Stephens, Jr. et al. | 365/222 |
| 5,463,590 | 10/1995 | Watanabe | 365/222 |
| 5,511,033 | 4/1996 | Jung | 365/222 |

*Primary Examiner*—David C. Nelms
*Assistant Examiner*—Trong Phan
*Attorney, Agent, or Firm*—Nikaido, Marmelstein, Murray & Oram LLP

[57] ABSTRACT

A volatile memory device or a refreshing method for refreshing information stored in a plurality of memory cells, comprises: a plurality of banks each having a plurality of cell array blocks each of which have a plurality of memory cells and a decoder portion for selecting the memory cells; an address buffer being supplied with an address signal; and a plurality of predecoders associated respectively with the banks, for being supplied with an output signal from the address buffer and supplying predecoded signals to the associated banks. When the volatile memory device is refreshed, the predecoder associated with one of the banks which is selected is activated, and a plurality of cell array blocks in the selected bank are simultaneously selected, and the predecoders associated with the banks which are unselected are inactivated. According to the present invention, the high speed refresh and low power consumption can be realized.

22 Claims, 13 Drawing Sheets

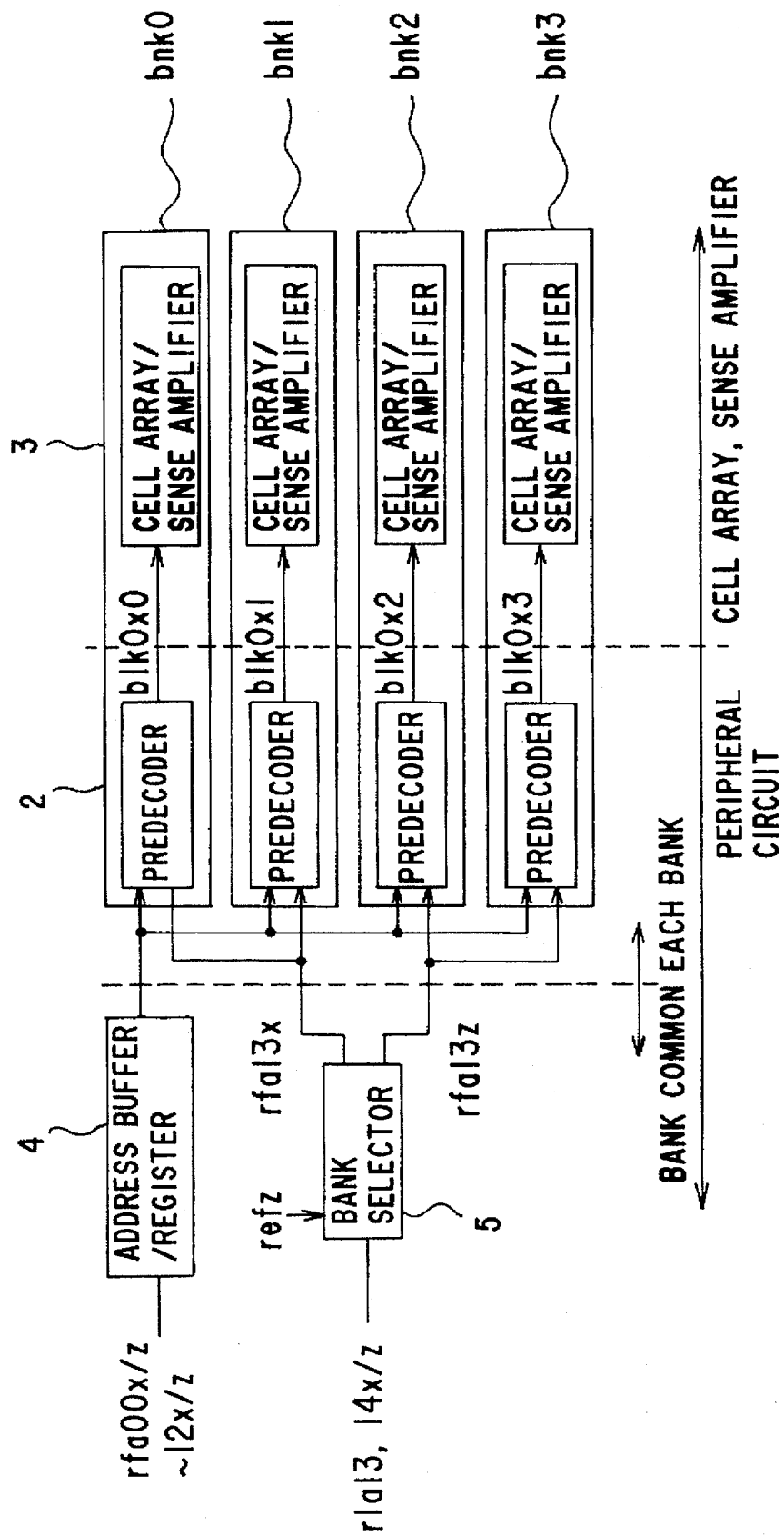

2

VOLATILE MEMORY DEVICE AND METHOD OF REFRESHING SAME

BACKGROUND OF THE INVENTION

1. Field of the invention

The present invention relates to a volatile memory device in the form of a semiconductor chip or the like, and more particularly to a volatile memory device capable of refreshing itself at a high rate with a relatively small amount of electric energy, and a method of refreshing such a volatile memory device.

2. Description of the Related Art

Widespread use of personal computers in recent years has resulted in growing demands for semi-conductor memories, particularly DRAMs (dynamic random-access memories). Since modern personal computers run complex software programs that require a large memory capacity, efforts have been made to develop DRAMs which have a greater storage capability and operate at a higher speed. Attention has been attracted to a synchronous DRAM, among other DRAM types, which can perform various functions in synchronism with a clock signal that is supplied from an external source.

The synchronous DRAM can refresh itself independently of the computer system which incorporates the synchronous DRAM, by generating refresh addresses inside of the memory using internal addresses. While the synchronous DRAM is being refreshed, word lines, which are at least twice as many as the word lines that are selected when the synchronous DRAM operates normally, are selected to satisfy a refresh period required by the refresh characteristics of cells and a refresh rate required by the computer system. When the synchronous DRAM is in normal operation, a common output word line is provided for a plurality of banks in an interleaved configuration, and only one of the banks is selected at a time. For refreshing the synchronous DRAM, however, since it is free of such limitations, a plurality of banks are selected at the same time, and more word lines are selected than in the normal operation.

FIG. 16 of the accompanying drawings schematically shows a conventional DRAM. As shown in FIG. 16, the conventional DRAM is roughly divided into four banks bnk0~bnk3, for example. Each of the banks bnk0~bnk3 includes a predecoder 2 and a cell array/sense amplifier section 3. The cell array/sense amplifier section 3 includes a decoder for decoding a predecoded signal supplied from the predecoder 2. The banks bnk0~bnk3 are connected to a common address buffer/register circuit 4 which is supplied with addresses for selecting memory cells in the banks bnk0~bnk3, and a common bank selector 5 for selecting the banks bnk0~bnk3.

When the conventional DRAM operates normally, the bank selector 5 selects one of the banks bnk0~bnk3, and inverted and non-inverted address signals supplied from the address buffer/register circuit 4 are decoded by the predecoder 2 and the decoder in the cell array/sense amplifier section 3 in the selected bank, thereby selecting a word line to select a memory cell.

When the conventional DRAM is refreshed, a refresh command signal refz is supplied to the bank selector 5, and inverted and non-inverted signals rfa13x, rfa13z are supplied to select two banks simultaneously. In each of the selected banks, the predecoder 2 and the decoder in the cell array/sense amplifier section 3 are activated to select a word line. Therefore, reading and rewriting cycles can be effected at a rate which is twice the rate in the normal operation, thus satisfying a refresh period required by the refresh characteristics of cells and a refresh rate required by the computer system.

Because the banks bnk0~bnk3 have the respective predecoders 2 and the respective cell array/sense amplifier sections 3, as shown in FIG. 16, when a plurality of banks are simultaneously selected, the predecoders 2 and the cell array/sense amplifier sections 3 in the selected banks are simultaneously activated. Consequently, these circuits simultaneously operate and consume an electric current. When refreshed, the conventional DRAM consumes an electric current which is twice larger than the electric current that is consumed during the normal operation in which only one bank is selected.

Greater memory storage capacities necessitate a larger number of word lines, which in turn require more complex and large-scale circuit arrangements for predecoders and cell array/sense amplifier sections for selecting word lines. Consequently, recent DRAMs tend to consume a more and more refreshing electric current.

SUMMARY OF THE INVENTION

It is an object of the present invention to provide a volatile memory device which is capable of refreshing itself at a high rate while minimizing the consumption of an electric current, and a method of refreshing such a volatile memory device.

Another object of the present invention is to provide a volatile memory device which has a plurality of divided banks and which can select a plurality of word lines in one of the banks to refresh itself at a high rate while minimizing the consumption of an electric current, and a method of refreshing such a volatile memory device.

Still another object of the present invention is to provide a volatile memory device which has a plurality of cell array blocks in one of banks thereof and which can simultaneously select a plurality of cell array blocks in a selected bank to select a plurality of word lines in the bank to refresh itself at a high rate while minimizing the consumption of an electric current, and a method of refreshing such a volatile memory device.

A further object of the present invention is to provide a volatile memory device which is constructed on the basis of a minimal improvement over a conventional volatile memory device in order to gain the capability to refresh itself at a high rate while minimizing the consumption of an electric current, and a method of refreshing such a volatile memory device.

A still further object of the present invention is to provide a volatile memory device which can simultaneously select a plurality of cell array blocks when it is refreshed even though a plurality of cell array blocks in each of banks are connected to a common sense amplifier, and a method of refreshing such a volatile memory device.

According to the present invention, the above objects can be achieved by a volatile memory device or a refreshing method for refreshing information stored in a plurality of memory cells, comprising: a plurality of banks each having a plurality of cell array blocks each of which have a plurality of memory cells and a decoder portion for selecting the memory cells; an address buffer being supplied with an address signal; and a plurality of predecoders associated respectively with the banks, for being supplied with an output signal from the address buffer and supplying predecoded signals to the associated banks; wherein when the volatile memory device is refreshed, the predecoder associated with one of the banks which is selected is activated, and a plurality of cell array blocks in the selected bank are simultaneously selected, and the predecoders associated with the banks which are unselected are inactivated.

With the above arrangement, only the predecoders associated with the selected bank and only the decoder portions in the selected bank are activated to consume an electric current, and a plurality of word lines are simultaneously selected to refresh the volatile memory device. The activation of a circuit means that an output signal from the circuit changes depending on a change in an address signal or a predecoded signal supplied to the circuit, and the inactivation of a circuit means that the circuit does not operate and does not change its output signal even when an address signal or a predecoded signal supplied to the circuit changes.

According to the present invention, the above object can also be achieved by a volatile memory device or a refreshing method for refreshing information stored in a plurality of memory cells, comprising: a plurality of banks each having a plurality of cell array blocks each of which have a plurality of memory cells and a decoder portion for selecting the memory cells; an address buffer for being supplied with an address signal; and a plurality of predecoders associated respectively with the banks, for being supplied with an output signal from the address buffer and supplying predecoded signals to the banks; wherein the banks have a sense amplifier shared by adjacent ones of the cell array blocks, the sense amplifier is connected to bit lines of selected ones of the cell array blocks, and bit lines of unselected ones of the cell array blocks are disconnected from the sense amplifier, and wherein when the volatile memory device is refreshed, plural ones of the cell array blocks which are positioned so as not to share the sense amplifier are simultaneously selected in a selected one of the banks.

with the above arrangement, plural ones of the cell array blocks which share the sense amplifier can simultaneously be selected without competing for the sense amplifier, so that an operation of refreshing the volatile memory device can be shortened.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 16 is a block diagram of a conventional DRAM.

DETAILED DESCRIPTION OF THE PREFERRED EMBODIMENT

Figure 1:
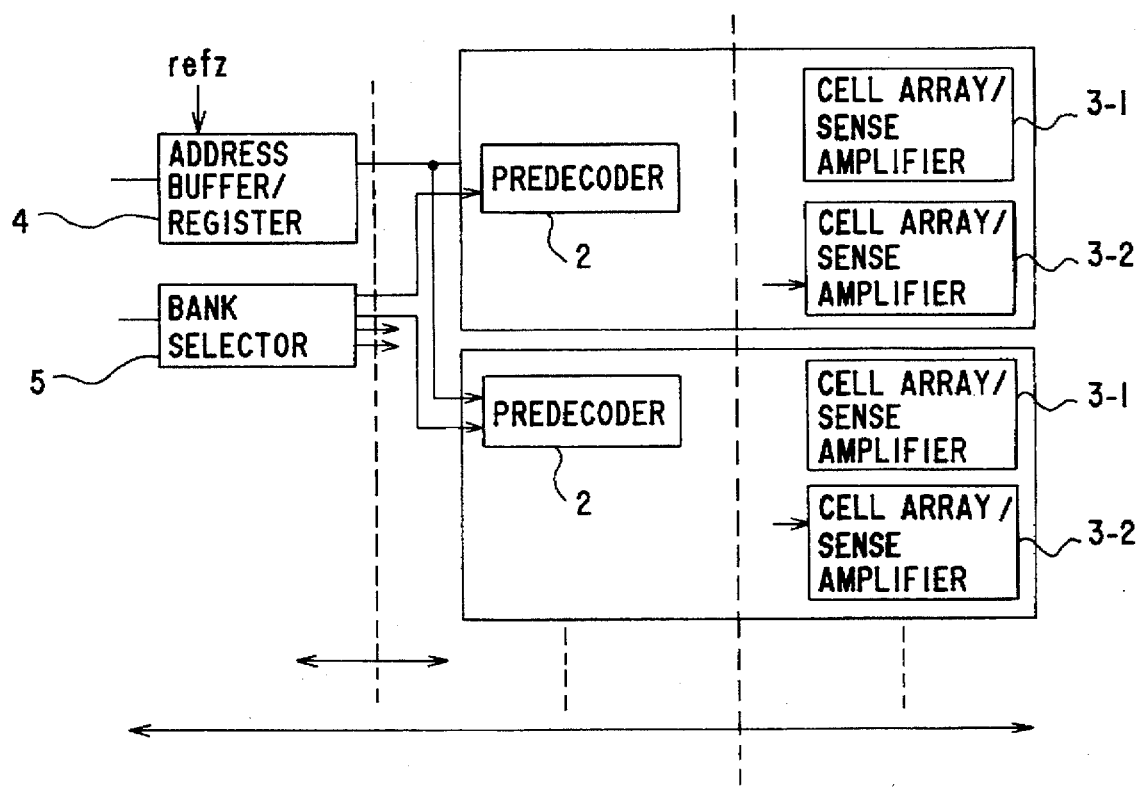
FIG. 1 is a block diagram of a DRAM according to an embodiment of the present invention.

As shown in FIG. 1, a DRAM according to the present invention has a plurality of banks bnk0 . . . (specifically, four banks bnk0–bnk3). Each of the banks includes a predecoder 2 and a plurality of cell array/sense amplifier blocks 3-1, 3-2. The banks are connected to a common address buffer/register circuit 4 which is supplied with addresses for selecting memory cells in the banks, and a common bank selector 5 for selecting the banks.

When the DRAM operates normally, one of the cell array/sense amplifier blocks 3-1, 3-2 is selected. When the DRAM is refreshed, a plurality of cell array/sense amplifier blocks are selected. Specifically, a refresh control signal refz is supplied to the address buffer/register circuit 4 which is connected to the predecoders 2, causing a suitable address to degenerate. Stated otherwise, inverted and non-inverted signals for addresses which can simultaneously select word lines that are not competitive in reading and rewriting cycles are brought into the same selected state. As a result, a plurality of blocks are selected, and word lines are selected respectively in the selected blocks. Consequently, a plurality of word lines are simultaneously selected in a single bank.

with the arrangement shown in FIG. 1, it is possible to minimize the number of activated predecoders which consume a relatively large electric current and the number of signal lines. Therefore, it is possible to select and activate a plurality of word lines simultaneously which are not competitive in reading and rewriting cycles thereby causing a refresh operation with higher speed.

Details of the DRAM according to the present invention will be described below with reference to FIGS. 2 through 15.

Figure 2:
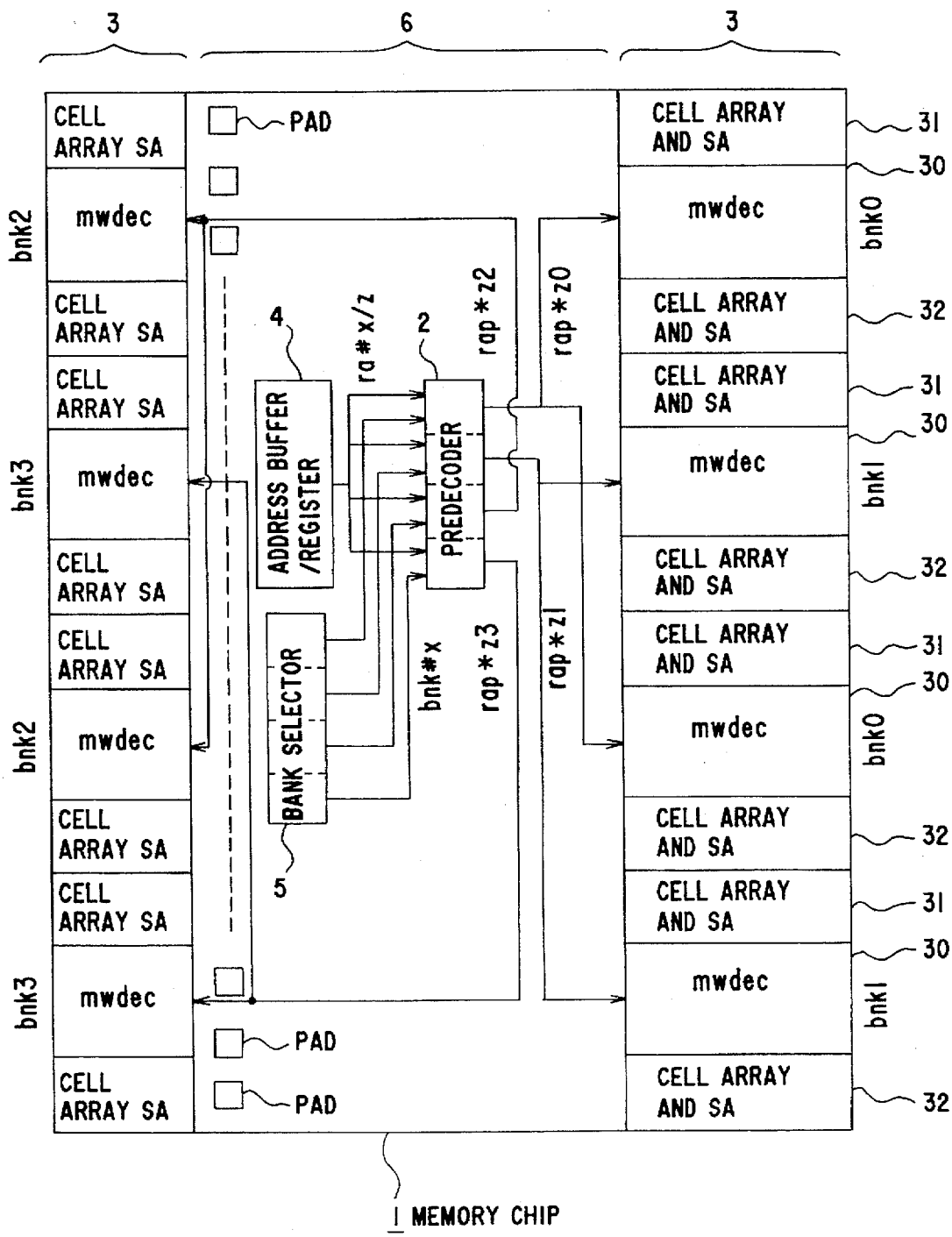
FIG. 2 is a detailed block diagram of a memory chip which incorporates the DRAM shown in FIG. 1.

Overall structure of a memory chip:

FIG. 2 shows a memory chip 1 which incorporates the DRAM according to the present invention. As shown in FIG. 2, the memory chip 1 has a central peripheral circuit region 6 which corresponds to the DRAM shown in FIG. 1, a main word decoder (mwdec) collumn region and a cell array/sense amplifier region 3 positioned on both sides of the peripheral circuit region 6. The peripheral circuit region 6 contains the bank selector 5, the address buffer/register circuit 4, and the predecoders 2 in the respective banks shown in FIG. 1. The peripheral circuit region 6 also contains a plurality of pads for receiving various input signals from external sources and transmitting output signals. Row address signals supplied to the pads are supplied to the address buffer/register circuit 4. The address buffer/register circuit 4 supplies an output signal to the predecoders 2 for activating the predecoder 2 which corresponds to the bank selected by the bank selector 5.

The cell array/sense amplifier region 3 is physically divided into eight regions, and each of the four banks bnk0–bnk3 comprises two separate regions. For example, the bank bnk0 is located in the right-hand cell array/sense amplifier region 3, and comprises an uppermost region and a third region as counted from above in FIG. 2. Each of the banks comprises a decoder region 30 having a main word decoder, etc., and two cell array/sense amplifier regions 31, 32 disposed one on each side of the decoder region 30. The decoder region 30 in each of the banks is supplied with a predecoded signal rap*z# (where # represents a bank number and * represents a predecoded number) from the corresponding predecoder 2.

Figure 3:
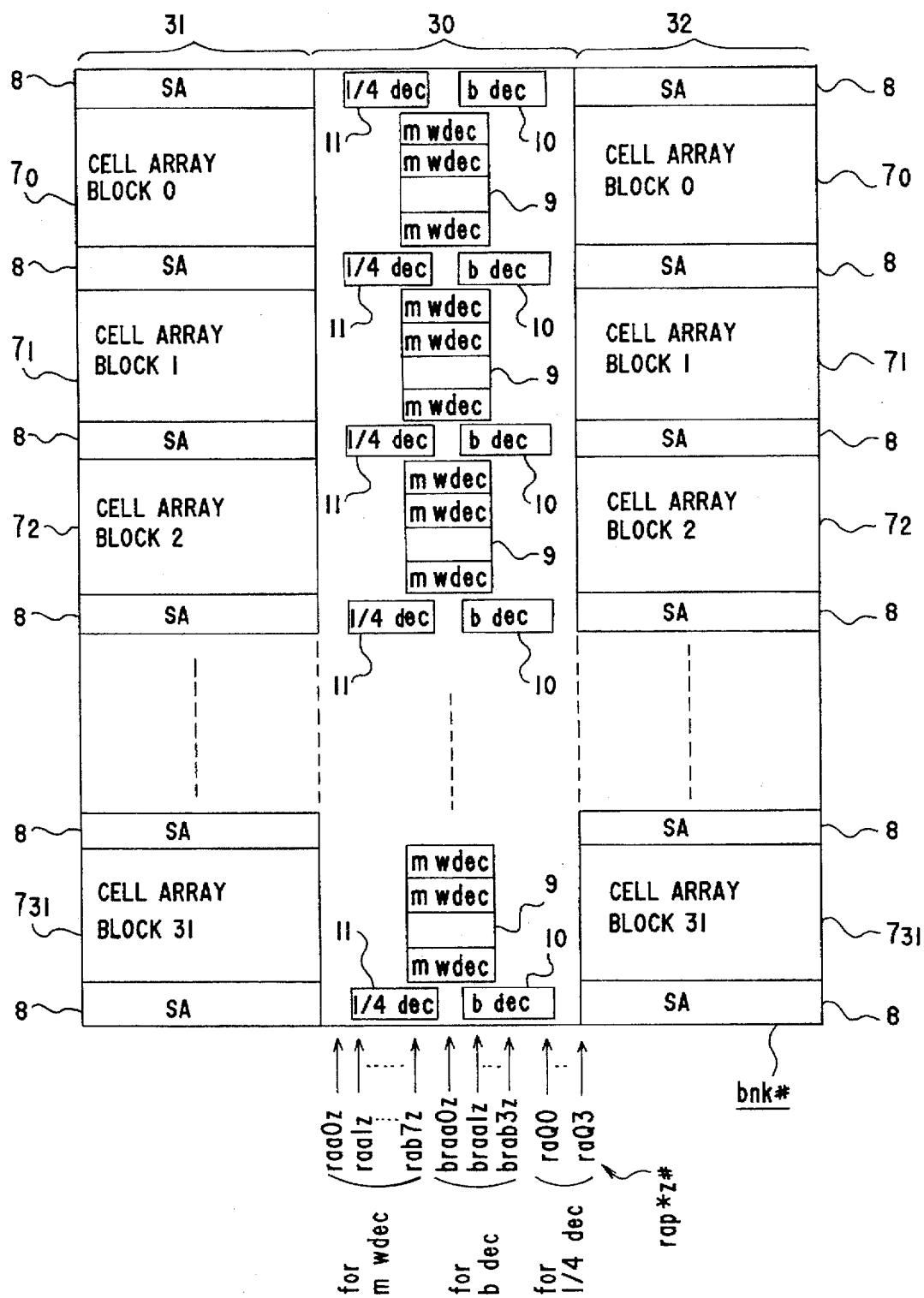
FIG. 3 is a detailed block diagram of each of banks of the memory chip shown in FIG. 2.

Structure of the bank:

FIG. 3 shows in detail each of banks of the memory chip shown in FIG. 2. As shown in FIG. 3, a bank bnk# contains a central decoder region 30 and two cell array/sense amplifier regions 31, 32 disposed one on each side of the decoder region 30. The bank bnk# has 32 cell array blocks $7_0 \sim 7_{31}$ disposed in each of the cell array/sense amplifier regions 31, 32. Though the corresponding pairs of cell array blocks $7_0 \sim 7_{31}$ in the cell array/sense amplifier regions 31, 32 are physically separate from each other, they serve as a single cell array block in terms of the logic of addresses. Therefore, word lines of the pairs of cell array blocks $7_0 \sim 7_{31}$ are simultaneously selected, and one of bit lines corresponding to the selected word lines is selected to read or write data. Each of the cell array/sense amplifier regions 31, 32 also has a pair of sense amplifiers 8 disposed one on each side of each of the cell array blocks $7_0 \sim 7_{31}$. Each of the sense amplifiers 8, as explained later, is shared by those cell array blocks which are disposed one on each side thereof, and is connected to only one of those cell array blocks which is selected and operates as a sense amplifier.

The decoder region 30 is supplied with a predecoded signal rap*z# (where # represents a bank number and * represents a predecoded number) from the corresponding predecoder 2, as described above. The decoder region 30 has block decoders 10, main word decoders 9, and ¼ decoders 11 which are supplied with corresponding signals. The main word decoders 9 are disposed in areas of the decoder region 30 which are sandwiched between the pairs of cell array blocks. Each of the main word decoders 9 selects one main word line. Selection signals from the main word decoders 9 and output signals from the ¼ decoders 11 are supplied to subword decoders (not shown) for finally selecting one subword line, as described in detail later on. The block decoders 10 and the ¼ decoders 11 are disposed in areas of the decoder region 30 which are sandwiched between the pairs of sense amplifiers 8. Each of the block decoders 10 supplies a block selection signal to the adjacent sense amplifier 8 and the main word decoder 9 which corresponds to a selected cell array block, as described in detail later on.

Figure 4:
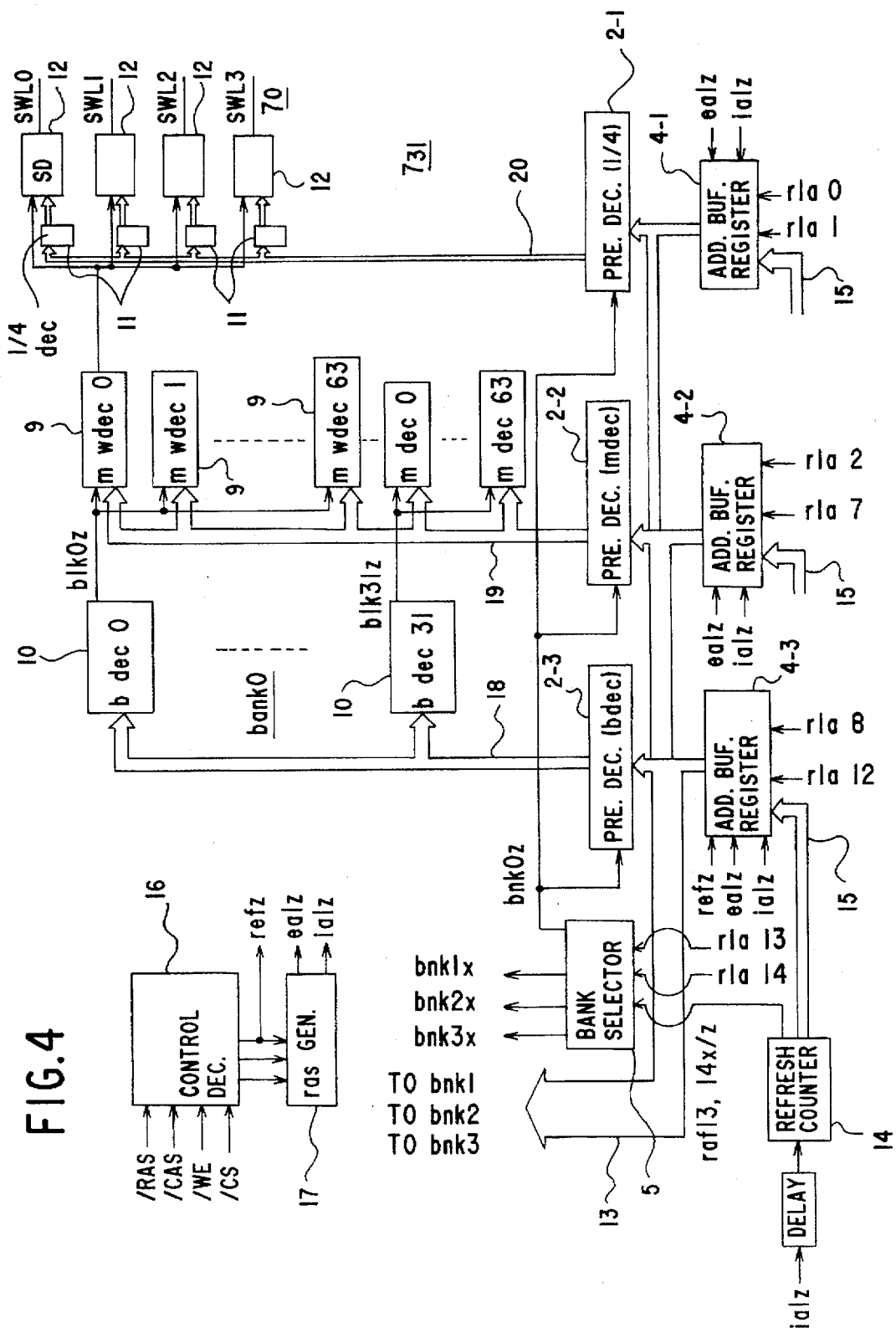
FIG. 4 is a block diagram showing a logical structure of row addresses.

Group of decoders for row addresses:

FIG. 4 shows a logical structure of row addresses. Specifically, FIG. 4 illustrates address buffers 4-1, 4-2, 4-3 and a bank selector 5 which are shared by the four banks bnk0~bnk3. FIG. 4 also illustrates predecoders 2-1, 2-2, 2-3, block decoders 10, main word decoders 9, and subword decoders 12 which are disposed in each of the four banks bnk0~bnk3. In FIG. 4, only the bank bnk0 is shown as a representative bank, with the other three banks being omitted from illustration.

A refresh counter 14 generates internal row addresses for refreshing the DRAM by incrementing an internal address latch signal ialz with a clock signal that has been delayed a certain period of time. The address buffers 4-1, 4-2, 4-3 are supplied with an internal row address signal 15 from the refresh counter 14 and row address signals rla0~rla12 from an external source. A control decoder 16 is supplied with control signals /RAS (Row Address Strobe), /CAS (Column Address Strobe), /WE (Write Enable), and /CS (Chip Select) from an external source. The control decoder 16 decodes a combination of these control signals to generate various internal control signals. In FIG. 4, the control decoder 16 outputs a refresh control signal refz indicative of a refresh operation and other control signals to a ras generator 17. In response to the refresh control signal refz, the ras generator 17 outputs an internal address latch signal ialz. If the control decoder 16 does not output a refresh control signal refz, then the ras generator 17 outputs an external address latch signal ealz in response to the other control signals.

The internal and external address latch signals ialz, ealz are supplied to the address buffers 4-1, 4-2, 4-3 to cause them to select either the internal row address signal 15 or the row address signals rla0~rla12. The refresh control signal refz is also supplied to an address buffer for selecting a plurality of memory cell array blocks in a refresh operation. In FIG. 4, the refresh control signal refz is supplied to the address buffer 4-3.

Output signals 13 from the address buffers are supplied to the corresponding predecoders 2-1, 2-2, 2-3. As shown in FIG. 4, the output signals 13 from the address buffers are also supplied to the other banks bnk1~bnk3. The predecoder 2-1 corresponds to the subword decoders 12, the predecoder 2-2 to the main word decoders 9, and the predecoder 2-3 to the block decoders 10. The predecoders 2-1, 2-2, 2-3 supply respective predecoded signals to the corresponding decoders.

The predecoders 2-1, 2-2, 2-3 are supplied with a bank selection signal bnk0z from the bank selector 5. The bank selector 5 supplies bank selection signals bnk1x~bnk3x to the predecoders in the other banks bnk1~bnk3. The predecoders 2-1, 2-2, 2-3 are activated according to a selected state of the bank selection signal bnk0z. When the predecoders 2-1, 2-2, 2-3 receive the bank selection signal bnk0z in an unselected state, the predecoders 2-1, 2-2, 2-3 are inactivated, and do not consume an electric current.

According to a predecoded signal 18 supplied from the predecoder 2-3, the block decoders 10 output block selection signals blk0z~blk31z for selecting memory array blocks. According to a predecoded signal 19 supplied from the predecoder 2-2 and the block selection signals blk#z (where # represents a block number), the main word decoders 9 select word lines in the memory cell blocks. The main word decoders 9 are activated according to a selected state of the block selection signal blk#z, and inactivated according to an unselected state of the block selection signal blk#z.

Finally, each of subword lines SWL0~SWLn is selected based on a combination of the main word decoders 9 and the subword decoders 12. According to output signals from the ¼ decoders 11 which are supplied with an output signal 20 from the predecoder 2-1 and output signal from the main word decoders 9, the subword decoders 12 finally select subword lines SWL0~SWLn and increase the potential of the word lines. More specifically, as described later on with respect to FIGS. 8 and 9, a predecoded signal 20 from the predecoder 2-1 is supplied to the ¼ decoders 11, which produce output signals for controlling the corresponding subword decoders 12.

Figure 5:
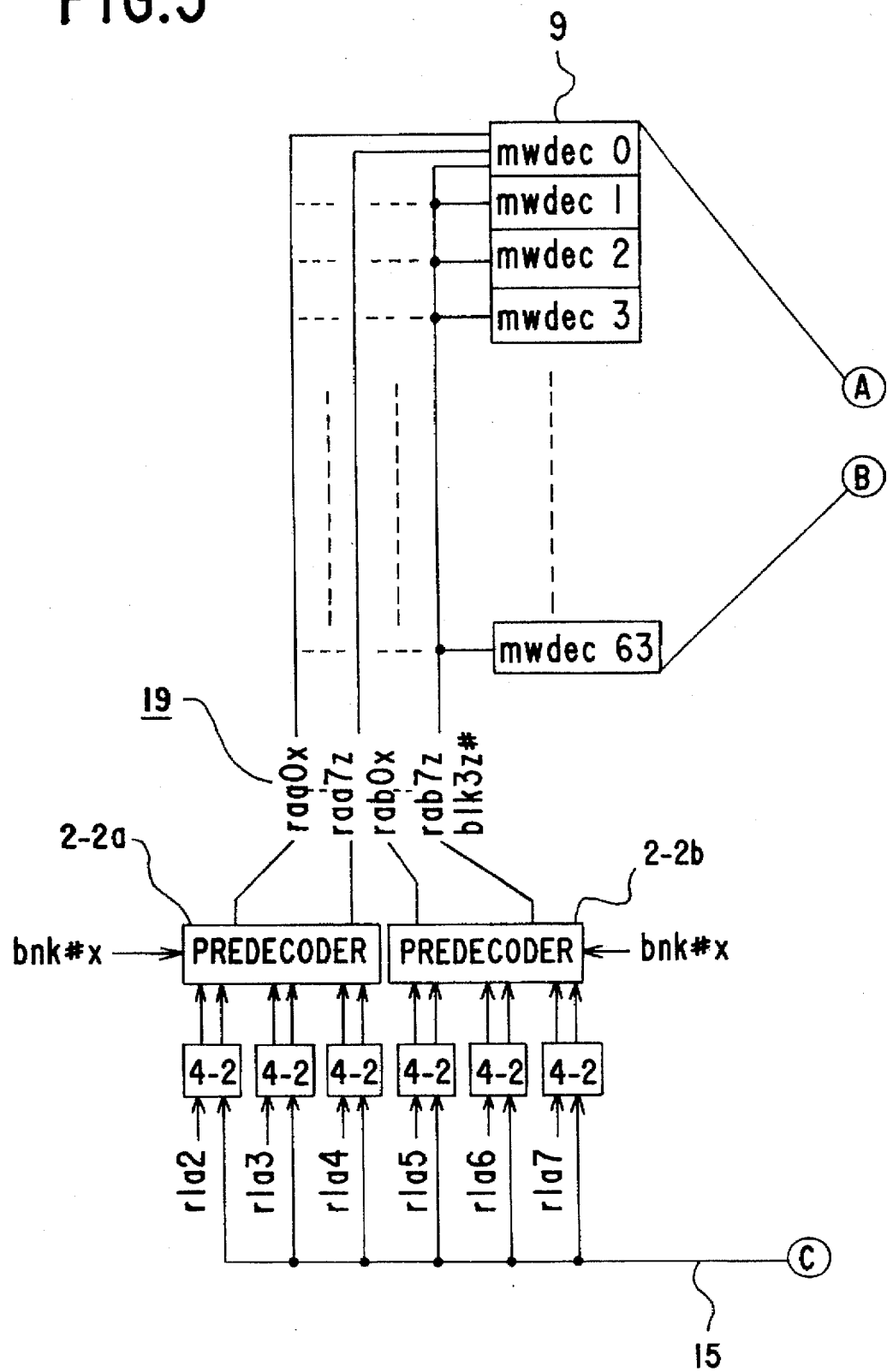
FIGS. 5 and 6 are block diagrams of a group of decoders for row addresses.
Figure 6:
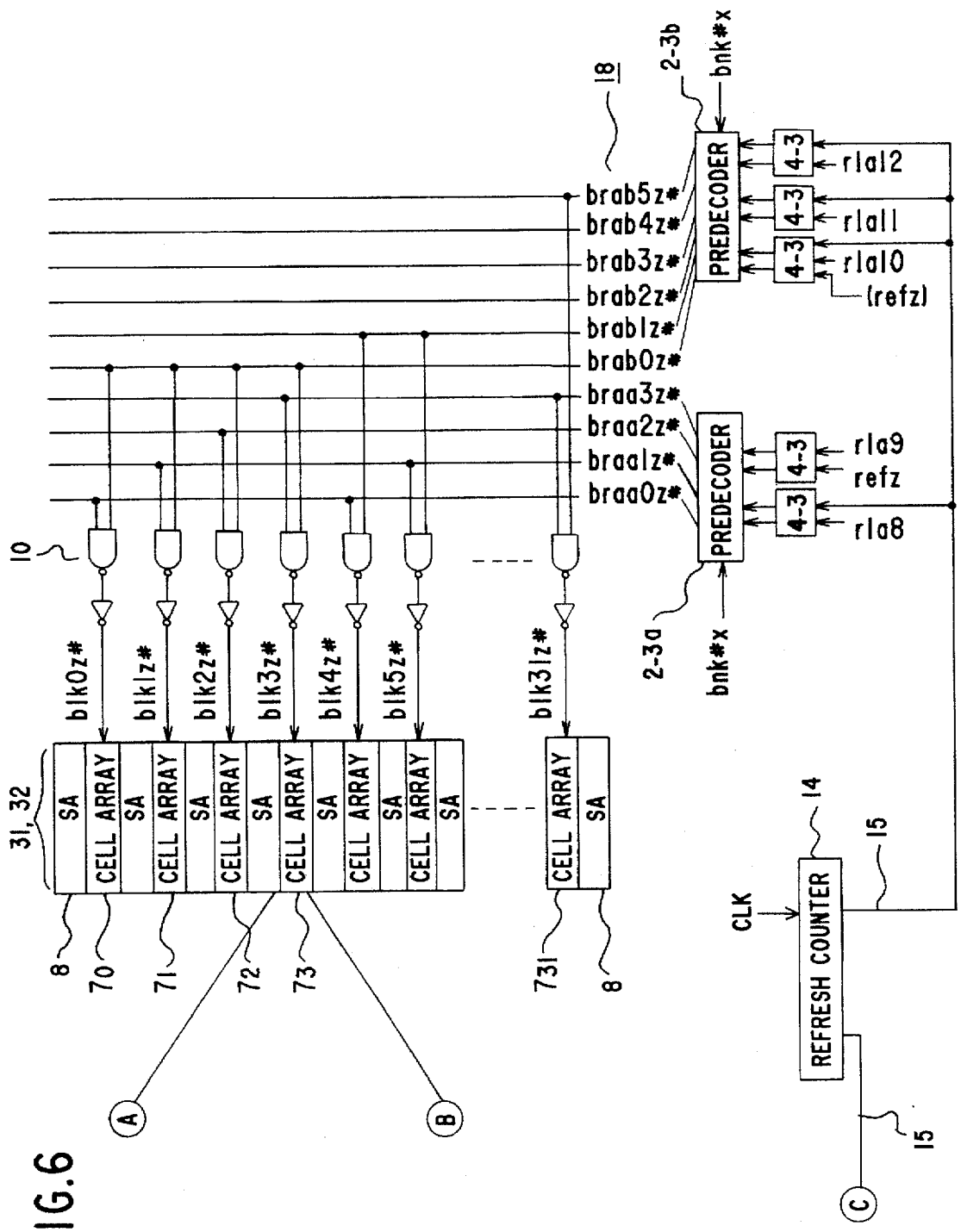

FIGS. 5 and 6 show a group of decoders for row addresses in greater detail. In particular, FIGS. 5 and 6 illustrate the block decoders 10 and the main word decoders 9 for the cell array blocks. Address buffers 4-3 are supplied with 5-bit external address signals rla8~rla12 and the internal address signal 15, and supply inverted and non-inverted signals to predecoders 2-3a, 2-3b. The predecoders 2-3a, 2-3b are also supplied with the bank selection signal bnk#x. The predecoders 2-3a, 2-3b supply part of predecoded signals 18 to the block decoders 10. When the bank selection signal bnk#x is in a selected state (L level), the predecoders 2-3a, 2-3b are activated. When the bank selection signal bnk#x is in an unselected state (H level), the predecoders 2-3a, 2-3b are inactivated, bringing their predecoded signals 18 into an unselected state (L level).

In this description, the suffix "x" added to various signals indicates that the L level represents an active or selected state, and the suffix "z" added to various signals indicates that the H level represents an active or selected state. However, whether the L level or the H level represents an active or selected state is not an essential requirement, but the representation of the L level and the H level may be changed as a matter of design.

The address buffer 4-3 which is supplied with the external address signal rla9 is supplied with the refresh control signal refz. When the refresh control signal refz is of a value indicative of a refreshing state, the corresponding refresh address degenerates. Therefore, both inverted and non-inverted signals from the address buffer 4-3 are in a selected state. As a result, output signals braa0z#, braa2z#, for example, from the predecoder 2-3a are brought simultaneously into a selected state (H level), simultaneously selecting cell array blocks 70, 72, for example. If the cell array blocks are of a shared sense amplifier configuration for sharing the sense amplifiers 8, then those cell array blocks which do not compete for the sense amplifiers 8 are simultaneously selected.

Figure 7:
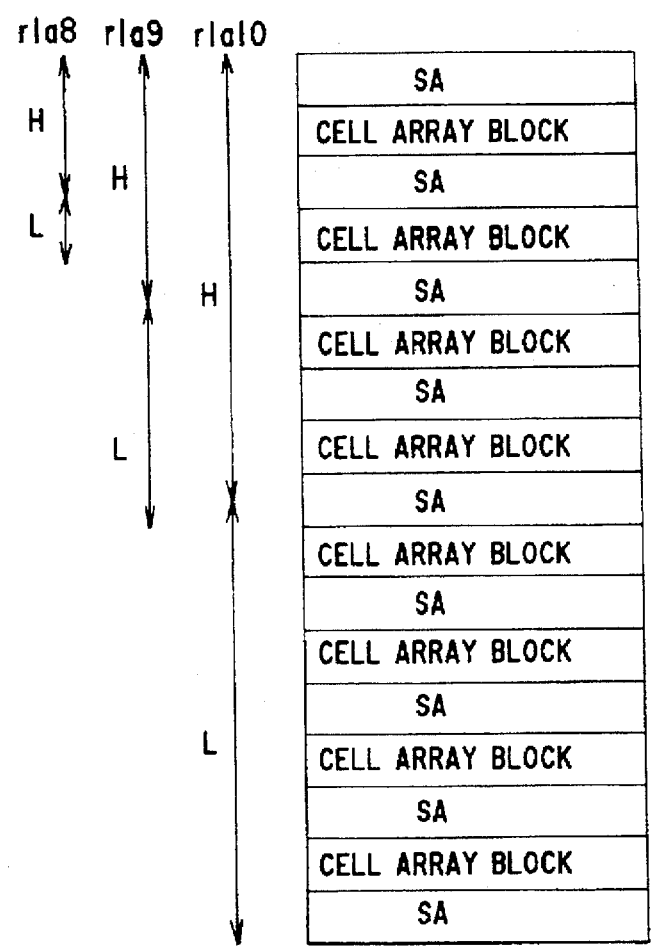
FIG. 7 is a diagram showing the relationship between addresses and cell array blocks.

FIG. 7 shows the relationship between addresses and cell array blocks for the purpose of illustrating the relationship between cell array blocks which do not compete for the sense amplifiers 8. FIG. 7 shows, by way of example, 8 cell array blocks with respect to 3 bits of addresses rla8, rla9, rla10. If the address rla8 degenerates, then the levels are not distinguished from each other, and adjacent cell array blocks are selected to compete for a sense amplifier. If either one of the addresses rla9, rla10 degenerates, then cell array blocks which are not adjacent to each other are simultaneously selected. The shared sense amplifier configuration will be described later on.

Referring back to FIGS. 5 and 6, the main word decoders 9 are shown at an enlarged scale in a region corresponding to the cell array block 73. As with the block decoders 10, the address buffers 4-2 are supplied with address signals rla2~rla7 and the internal row address signal 15 from the refresh counter 14, and supply inverted and non-inverted signals to the predecoders 2-2a, 2-2b. The predecoders 2-2a, 2-2b are also supplied with the bank selection signal bnk#x. When the bank selection signal bnk#x is in a selected state (L level), the predecoders 2-2a, 2-2b are activated. When the bank selection signal bnk#x is in an unselected state (H level), the predecoders 2-2a, 2-2b are inactivated. As can be understood from specific circuits described later on, the activation of a circuit means that when an address signal supplied to the circuit changes, the circuit operates and changes its output signal.

Output signals 19 from the predecoders 2-2a, 2-2b are supplied to the corresponding main word decoders 9. The main word decoders 9 are supplied with a block selection signal blk3z#. As with the predecoders, the main work decoders 9 are activated or inactivated depending on whether the block selection signal blk3z# is in a selected state or an unselected state. The main work decoders 9 are activated when block selection signal blk3z# is of H level. When the main work decoders 9 are activated, one of the 64 main word decoders 9 in one cell array block, which is selected depending on the state of the address signals rla2~rla9, outputs a selection signal.

Figure 8:
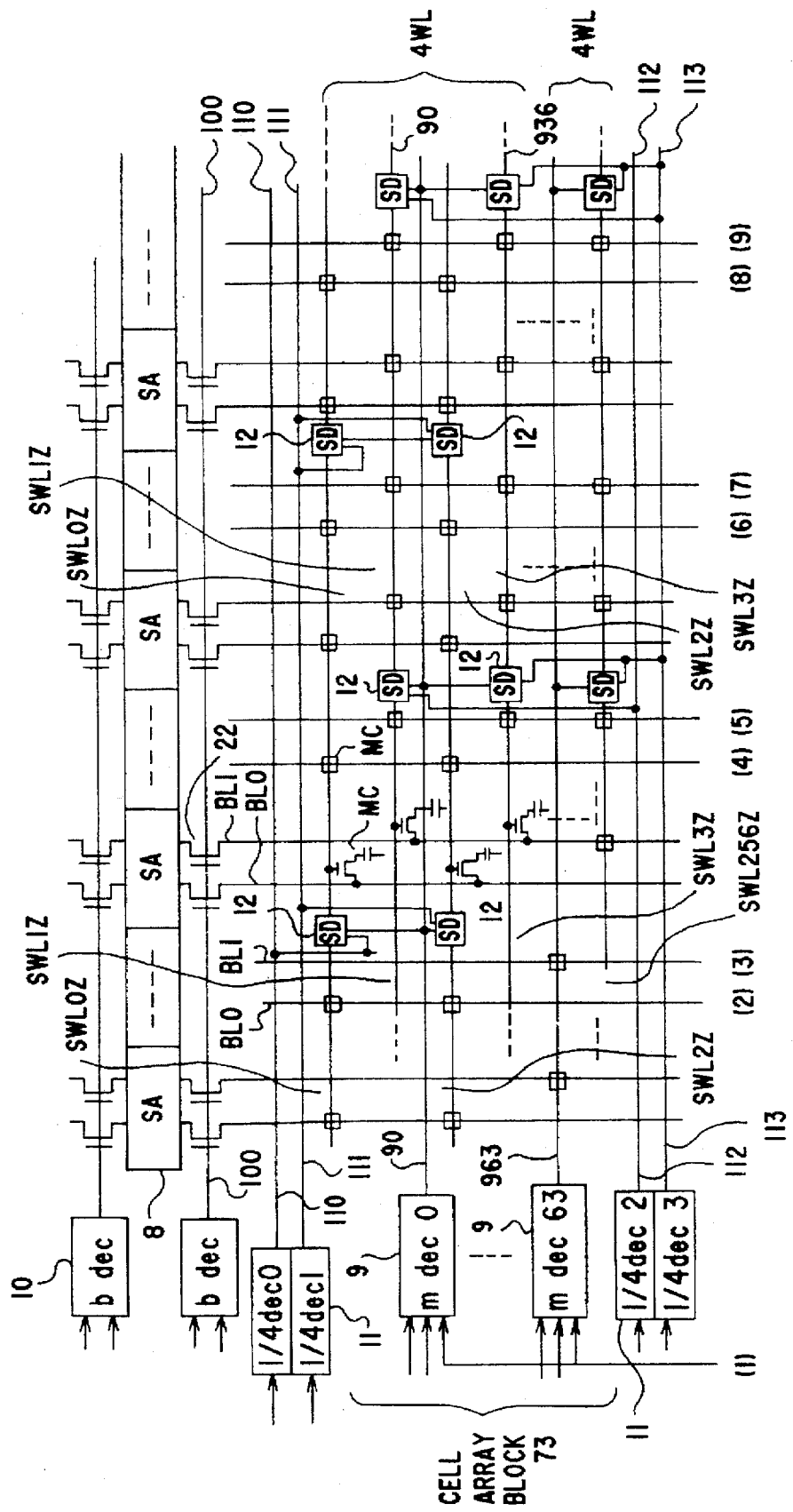
FIGS. 8 and 9 are circuit diagrams, partly in block form, of cell array blocks.
Figure 9:
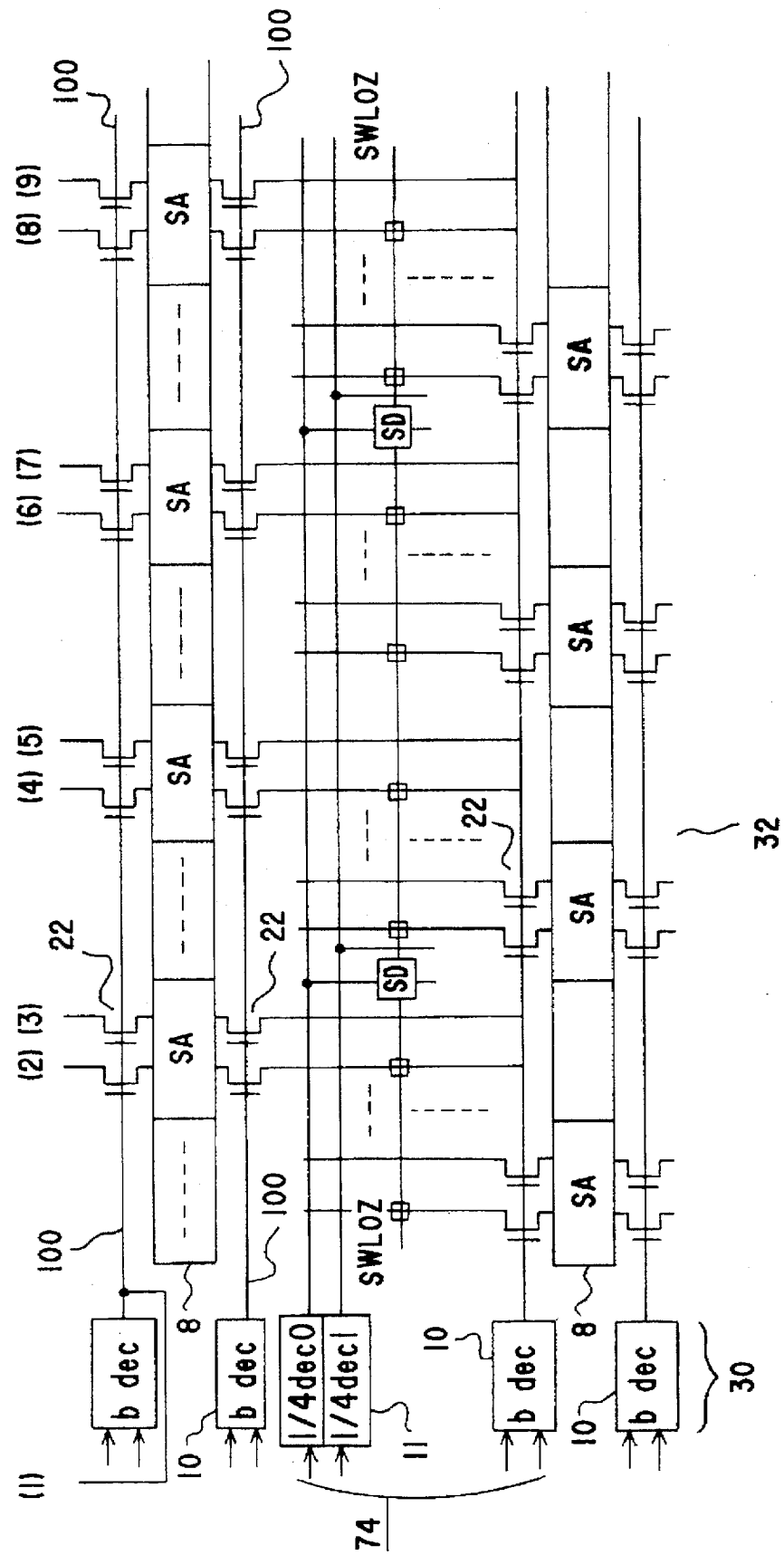

Circuit of cell array block:

FIGS. 8 and 9 show a circuit of cell array blocks 73, 74 and circuits in the vicinity thereof. Sense amplifiers 8 are disposed between these cell array blocks 73, 74.

The relationship between memory cells MC, subword lines, and bit lines will be described below. Subword lines SWL are divided in the direction of rows and extend on both sides of subword decoders (SD) 12. For example, a subword line SWL0z is connected to two subword decoders (SD) 12 and divided thereby. The reasons for dividing the subword line are to prevent a startup time thereof from being delayed, which would otherwise be delayed if the word line were longer, and also to lessen the pitch of a main word line 90. Bit lines BL0, BL1 extend in the direction of columns, and are connected alternately to upper and lower sense amplifiers 8 through coupling transistors 22. This is because the pitch of a pair of bit lines is shorter than the pitch of sense amplifiers in the direction of rows. Each of memory cells MC comprises a single transistor and a single capacitor. When the subword line connected to a memory cell MC is energized, an H or L level stored in the capacitor thereof is read onto the bit line connected to the memory cell MC, or written from the bit line into the capacitor.

For example, it is assumed that the cell array block $7_3$ is selected. The block decoders 10 that are positioned respectively above and below the cell array block $7_3$ output H-level selection signals. As a result, the transistors 22 that connect the sense amplifiers 8 to the bit line pairs are rendered conductive. Therefore, the bit lines BL0, BL1 of the cell array block $7_3$ are connected to the sense amplifiers 8 positioned above and below the cell array block $7_3$. On the other hand, the transistors between the bit lines of an adjacent cell array block $7_4$, which is in an unselected state, and the transistor 22 in the block $7_4$ are turned off, disconnecting the bit lines and the sense amplifier 8 from each other. In this manner, adjacent cell array blocks share a sense amplifier which is positioned therebetween for thereby achieving a highly integrated memory circuit construction. As described above, in the case where a sense amplifier is shared by adjacent cell array blocks, it is necessary to select a plurality of cell array blocks which are not in a mutually competitive position, in order to select plural cell array blocks according to the degeneration of addresses.

For selecting a subword line, either one of the main word decoders 9 outputs a selection level to the corresponding one of main word lines $9_0$~$9_{63}$ which serve as output lines of the main word decoders 9. The main word lines $9_0$~$9_{63}$ extend in the direction of rows as with the subword lines. Each of the main word lines $9_0$~$9_{63}$ is associated with a set of four subword lines 4WL and extends in the direction of rows at an intermediate position in the set of four subword lines 4WL. Each of the main word lines $9_0$~$9_{63}$ supplies a selection signal to the subword decoders (SD) 12 which are connected to the corresponding four subword lines. ¼ decoders 11 are disposed in the vicinity of the sense amplifiers 8 within the decoder region 30. As shown in FIGS. 8 and 9, the ¼ decoders 11 include four decoders, with two of the decoders being disposed above the cell array block and the other two below the cell array block. The ¼ decoders 11 have respective output lines 110~113 extending in the direction of rows along the sense amplifiers 8. The output lines 110~113 supply output signals from the ¼ decoders 11 to the subword decoders 12 connected to the corresponding four subword lines. When the subword decoders 12 are supplied with selection signals from both the main word decoders 9 and the ¼ decoders 11, they drive the subword lines connected thereto to raise the level of the subword lines.

A process of reading data from and writing data in the DRAM of the one-transistor type is well known in the art, and will not be described below.

Figure 10:
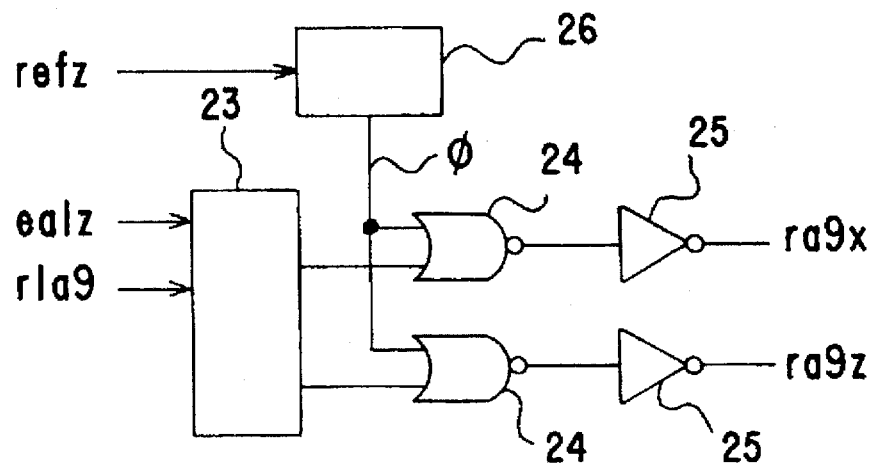
FIG. 10 is a block diagram of an address buffer for addresses which degenerate.
Figure 11:
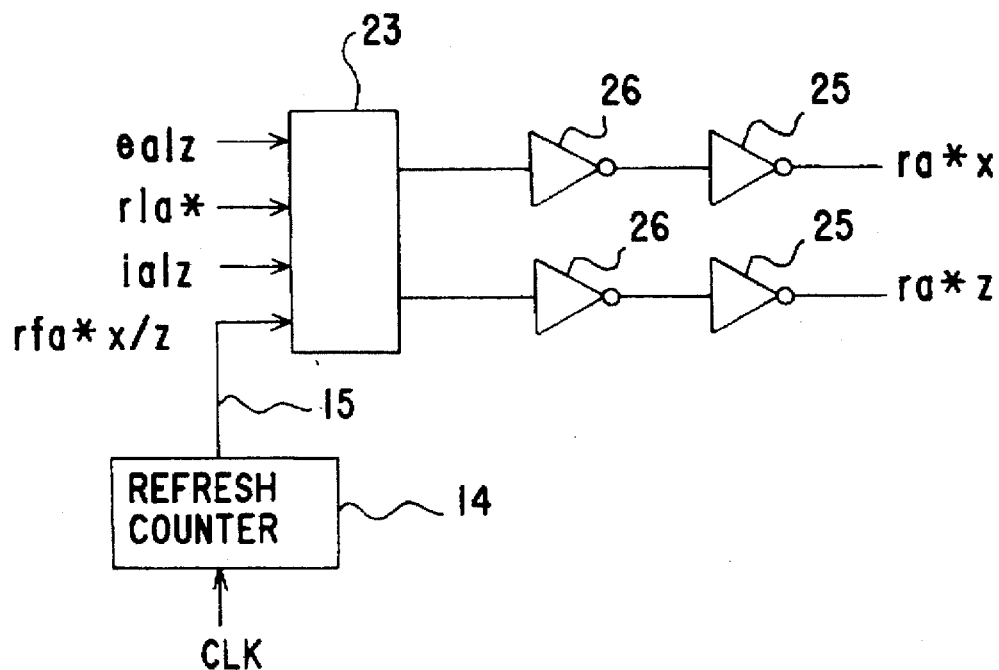
FIG. 11 is a block diagram of an address buffer for addresses which do not degenerate.

Address buffer:

FIGS. 10 and 11 show address buffers in specific detail. FIG. 10 illustrates an address buffer for addresses which degenerate. As described above, the address buffer which degenerates is supplied with an address from an external source and is not supplied with an internal address from the refresh counter 14. The address buffer has an inverted and non-inverted signal generator 23 for generating inverted and non-inverted signals. The inverted and non-inverted signals which are generated are passed through NOR gates 24 and inverters 25, and outputted as inverted and non-inverted address signals ra9x, ra9z, respectively. When the DRAM is in normal operation, since a signal φ is of an L level, it does not affect the inverted and non-inverted address signals ra9x, ra9z. When the DRAM is refreshed, the refresh control signal refz goes high, causing a degeneration control signal generator 26 to bring the signal φ into an H level. Therefore, the inverted and non-inverted address signals ra9x, ra9z are forcibly brought into the same level (H level). As a result, as shown in FIGS. 5 and 6, the predecoder 2–3a brings two output signals into an H level representing a selected state, simultaneously selecting two cell array blocks.

FIG. 11 illustrates an address buffer for addresses which do not degenerate. Those parts shown in FIG. 11 which are identical to those shown in FIG. 10 are denoted by identical reference numerals. In response to an external address latch signal ealz or an internal address latch signal ialz, an external address rla* (* represents an address number) or an internal address rfa*x/z outputted from the refresh counter 14 becomes effective. Output signals from an inverted and non-inverted signal generator 23 are shaped in waveform by two pairs of inverters 25, 26, which output inverted and non-inverted signals ra*x, ra*z.

Figure 12:
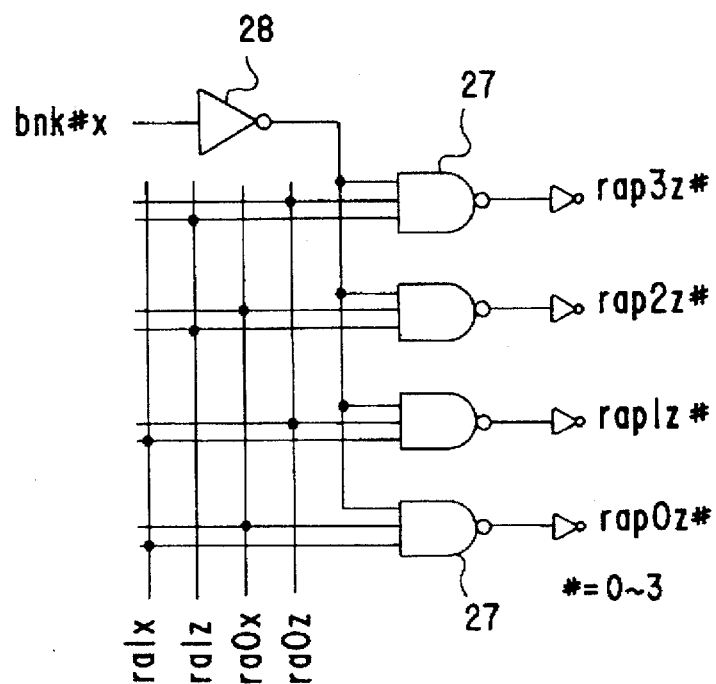
FIG. 12 is a circuit diagram, partly in block form, of a predecoder.
Figure 13:
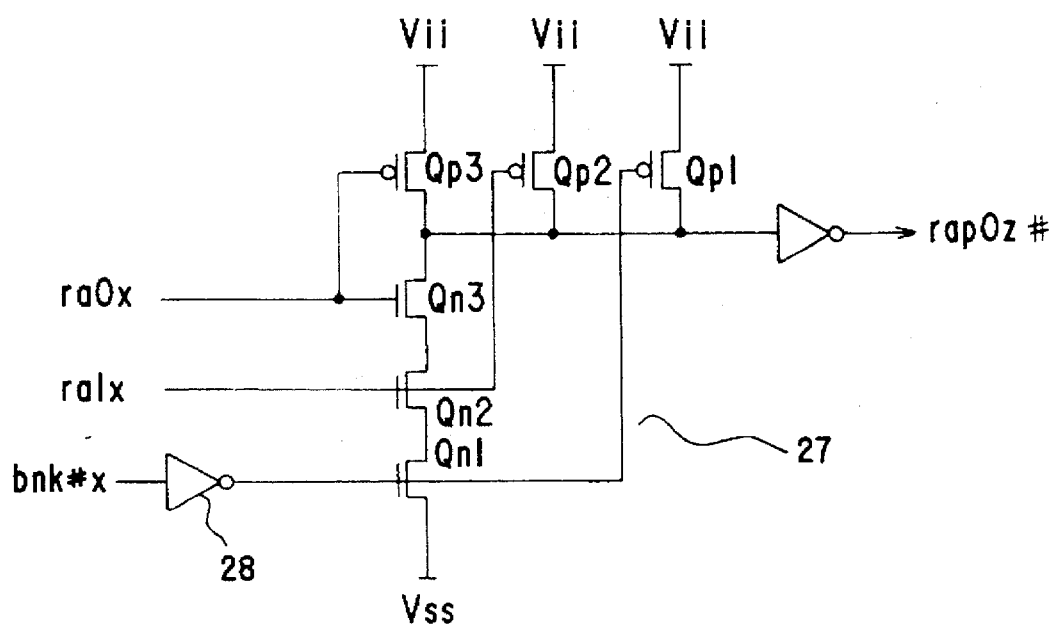
FIG. 13 is a detailed circuit diagram, partly in block form, of the predecoder shown in FIG. 12.

Predecoder and main decoder:

FIG. 12 shows a predecoder by way of example, and FIG. 13 shows a specific circuit arrangement of the predecoder. As shown in FIG. 12, a predecoder is supplied with inverted and non-inverted signals from an address buffer, which are applied to corresponding NAND gates 27. At the same time, a bank selection signal bnk#x (# represents a bank number 0–3 as shown in FIG. 12) is supplied through an inverter 28 to the NAND gates 27. When the bank selection signal bnk#x is of a selected level (L level), one of the NAND gates 27 outputs a selected level (L level) depending on the state of an address signal, bringing one of predecoded signals rap0z#~rap3z# into an H level. When the bank selection signal bnk#x is of an unselected level (H level), output signals from the NAND gates 27 are forcibly brought into an L level regardless of the state of an address signal, so that all the predecoded signals rap0z#~rap3z# are of an unselected level (H level).

Activated and inactivated states of the predecoder can be understood from the circuit arrangement of the NAND gate 27 shown in FIG. 13. The circuit arrangement shown in FIG. 13 comprises a CMOS NAND gate comprising three P-channel transistors Qp1, Qp2, Qp3 and three N-channel transistors Qn1, Qn2, Qn3. When a corresponding bank is in a selected state, since the bank selection signal bnk#x is in a selected state (L level), the inverter 28 outputs an H-level signal, turning on the transistor Qn1. Therefore, the output signal rap0z# is brought into an H level or an L level depending on the states of the output signals ra0x, ra1x from the address buffer. When the DPJLM is refreshed, it consumes an electric current in response to a change in refresh addresses. When a corresponding bank is in an unselected state, since the bank selection signal bnk#x is in an unselected state (H level), the output signal from the inverter 28 goes low, turning off the transistor Qn1. Therefore, the output signal rap0z# is forcibly brought into an L irrespective of the states of the output signals ra0x, ra1x from the address buffer. Consequently, the DRAM consumes almost no electric current as the output signal rap0z# does not switch between an H level and an L level.

Therefore, when a corresponding bank is selected, the predecoder is activated by a bank selection signal. When a corresponding bank is not selected, the predecoder is inactivated.

Figure 14:
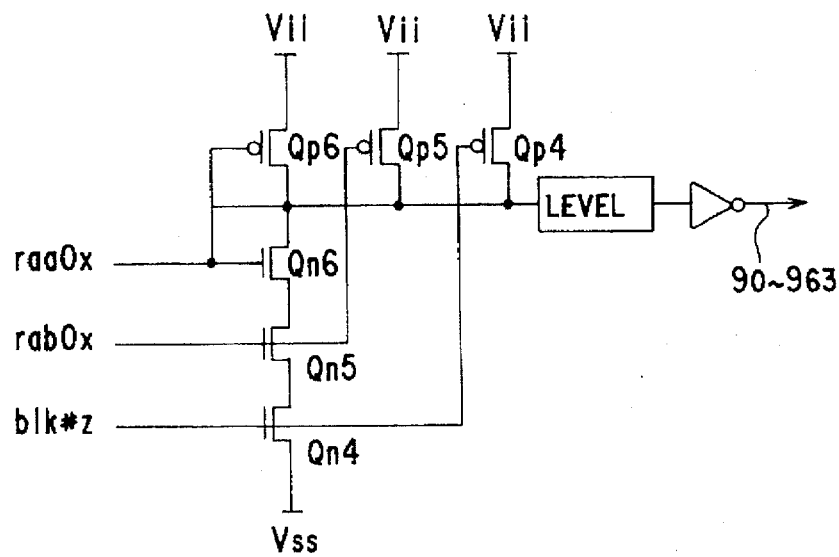
FIG. 14 is a circuit diagram, partly in block form, of a main word decoder.

FIG. 14 shows a main word decoder by way of example. The main word decoder shown in FIG. 14 comprises a CMOS NAND gate comprising three P-channel transistors Qp4, Qp5, Qp6 and three N-channel transistors Qn4, Qn5, Qn6, as with the predecoder shown in FIG. 13. The main word decoder shown in FIG. 14 differs from the predecoder shown in FIG. 13 in that it is supplied with a block selection signal blk#z (# represents a block number) for selecting a cell array block, and a level converter is added to an output stage for converting an output signal level. When a corresponding block selection signal is of an unselected level (L level), the main word decoder is inactivated, and when a corresponding block selection signal is of a selected level (H level), the main word decoder is activated.

Refreshing operation:

Refreshing operation based on an internal address will be described below again. When the DRAM is refreshed, the control decoder 16 (see FIG. 4) outputs a refresh control signal refz. In response to the refresh control signal refz, the ras generator 17 outputs an internal address latch signal ialz which is of a selected level. Each address buffer is supplied with the output signal 15 from the refresh counter 14. At the same time, the refresh control signal refz is also supplied to the address buffer 4-3 (see FIGS. 5 and 6), causing a corresponding address to degenerate. As a consequence, the address buffer produces H-level output signals, selecting a plurality of cell array blocks from a single bank. If adjacent cell array blocks share a sense amplifier, then a plurality of cell array blocks which do not compete for the sense amplifier are selected. All decoders including predecoders corresponding to unselected memory banks and main word decoders in the memory banks are inactivated. Such inactivated circuits do not consume an electric current even when the output signal from the refresh counter 14 varies successively in the refreshing operation.

Referring back to FIGS. 5 and 6, more than two cell array blocks may be selected in one bank. For selecting more than two cell array blocks in one bank, the address buffer 4-3 corresponding to the address rla10 is also supplied with the refresh control signal refz. As a result, a degenerate address is of two bits, simultaneously selecting four cell array blocks. However, because the number of main word decoders 9 which are simultaneously activated in the bank increases as much, operating circuits concentrate in one area, increasing noise due to a peak current. For this reason, the number of cell array blocks that are simultaneously selected is determined depending on an allowable consumption current range.

According to another arrangement, within an allowable consumption current range, two banks may be selected, and a plurality of cell array blocks may be selected in each of the selected banks. In this case, predecoders corresponding to the selected banks are also activated. Therefore, when four cell array blocks are simultaneously selected on the entire chip, the average consumption current is smaller if the four cell array blocks are simultaneously selected in a single bank than in a plurality of banks.

Figure 15:
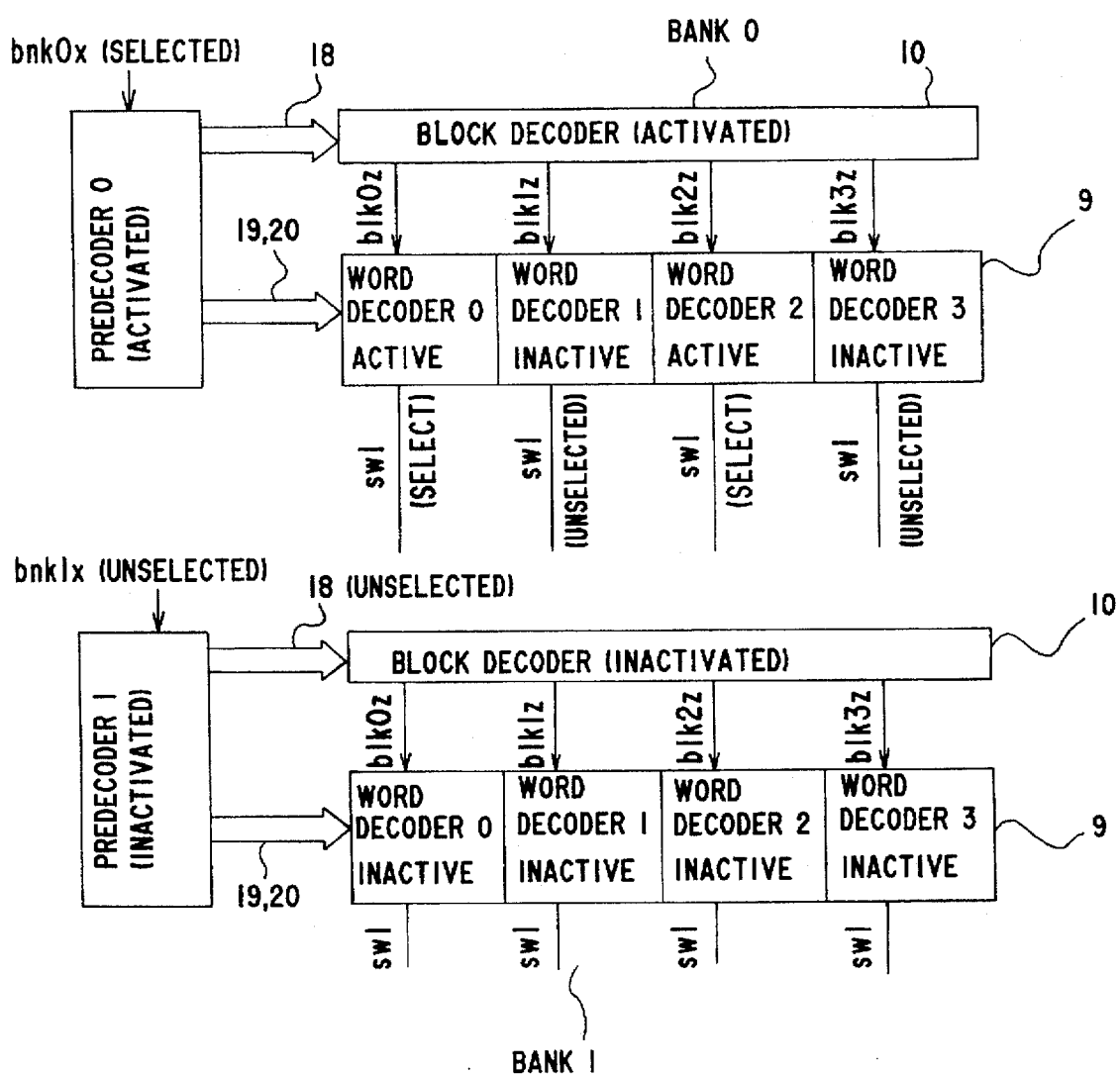
FIG. 15 is a block diagram showing the relationship between activated and inactivated decoders.

FIG. 15 shows the relationship between activated and inactivated decoders with respect to banks 0, 1. In FIG. 15, the bank 0 is in a selected state with a plurality of cell array blocks being selected, and the bank 1 is in an unselected state. Bank selection signals bnk0x, bnk1x are supplied to corresponding predecoders 0, 1, activating the predecoder 0 and inactivating the predecoder 1. Block decoders 10 in the bank 1 in the unselected state are all supplied with a predecoded signal 18 in an unselected state, and are inactivated. Similarly, all word main decoders 9 in the bank 1 are inactivated.

In the selected bank 0, the block decoders 10 are supplied with a predecoded signal 18 from the predecoder 0 in the activated state, and are activated. The main word decoders 9 in the cell array blocks are activated only for selected blocks 0, 2 according to block selection signals blk0–blk3. Therefore, only selected blocks are activated whereas unselected blocks are inactivated. Cell array blocks 0, 2, not shown in FIG. 15, which are not adjacent to each other are simultaneously selected so as not compete for a sense amplifier.

As can be seen from FIG. 15, since only decoders 9, 10 in a necessary area are activated, the refreshing process can be shortened while reducing the consumption of an electric current.

According to the present invention, as described above, when the DRAM is refreshed according to an internal address signal, a plurality of cell array blocks in a selected bank are simultaneously selected to prevent a plurality of predecoders from being simultaneously activated by the simultaneous selection of a plurality of banks. Therefore, an electric current consumed when the DRAM is refreshed can be reduced.

Although certain preferred embodiments of the present invention have been shown and described in detail, it should be understood that various changes and modifications may be made therein without departing from the scope of the appended claims.

What is claimed is:

1. A volatile memory device for refreshing information stored in a plurality of memory cells, said device comprising:
   a plurality of banks each having a plurality of cell array blocks each of which has a plurality of memory cells and a decoder portion for selecting the memory cells;
   an address buffer being supplied with an address signal; and
   a plurality of predecoders associated respectively with associated banks of said plurality of banks, for being supplied with an output signal from said address buffer and supplying predecoded signals to said associated banks;
   wherein when the volatile memory device is refreshed, the predecoder associated with one of said banks which is selected is activated, and a plurality of cell array blocks in the selected bank are simultaneously selected, and the predecoders associated with the banks which are unselected are inactivated.

2. A volatile memory device according to claim 1, wherein said decoder portion has block decoders for selecting the cell array block and word decoders for selecting word line connected to the memory cells, and wherein said block decoders are supplied with the predecoded signals from associated predecoders, and that when the associated predecoders are inactivated, said block decoders are supplied with predecoded signals in an unselected state, and when the associated predecoders are activated, said block decoders are supplied with predecoded signals according to the address signal, and when the volatile memory device is refreshed, plural ones of said block decoders output to selected decoded signals.

3. A volatile memory device according to claim 2, wherein said block decoders are supplied with predecoded signals in an unselected state and output unselected decoded signals when said predecoders are inactivated.

4. A volatile memory device according to claim 2 or 3, wherein said word decoders are supplied with predecoded signals from associated predecoders and decoded signals outputted from said block decoders, and wherein the word decoders associated with the selected cell array blocks select a single word line in the selected cell array blocks depending on the supplied predecoded signals, and the word decoders associated with unselected cell array blocks are inactivated.

5. A volatile memory device according to claim 1, wherein said decoder portion has block decoders for selecting the cell array block and word decoders for selecting word line connected to the memory cells, and wherein the predecoder associated with the selected bank is activated, the word decoders associated with the cell array blocks selected in the selected bank are activated to select a word line, the word decoders associated with the cell array blocks which are unselected in the selected bank are inactivated, and that the predecoders associated with the unselected banks are inactivated, and the block decoders and the word decoders in the unselected banks are inactivated.

6. A volatile memory device according to claim 1, wherein when the volatile memory device is refreshed, the address signal for selecting the cell array blocks is caused to degenerate.

7. A volatile memory device according to claim 1, wherein said decoder region has block decoders for selecting the cell array block and word decoders for selecting word line connected to the memory cells, and wherein the volatile memory device is refreshed, the address signal supplied from said address buffer to the predecoders associated with the block decoders is caused to degenerate.

8. A volatile memory device according to claim 6 or 7, wherein when the address signal is caused to degenerate, inverted and non-inverted output signals from the address buffer supplied with the degenerate address signal are brought into the same level as each other.

9. A volatile memory device according to claim 1, wherein a single bank is selected from said plural banks, and only the predecoders associated with the selected bank are activated, and the predecoders associated with the unselected banks are inactivated.

10. A volatile memory device according to claim 1, further comprising a bank selector for being supplied with the address signal and supplying a bank selection signal to the predecoders associated with the banks.

11. A volatile memory device for refreshing information stored in a plurality of memory cells, said device comprising:
   a plurality of banks each having a plurality of cell array blocks each of which has a plurality of memory cells and a decoder region for selecting the memory cells;
   an address buffer being supplied with an address signal; and
   a plurality of predecoders associated respectively with associated banks of said plurality of banks, for being supplied with an output signal from said address buffer and supplying predecoded signals to said associated banks;
   wherein said banks have a sense amplifier shared by adjacent ones of said cell array blocks, the sense amplifier is connected to bit lines of selected ones of said cell array blocks, and bit lines of unselected ones of said cell array blocks are disconnected from the sense amplifier, and wherein when the volatile memory device is refreshed, plural ones of said cell array blocks which are positioned so as not to share said sense amplifier are simultaneously selected in a selected one of said banks.

12. A volatile memory device according to claim 11, wherein when the volatile memory device is in normal operation, a single one of the cell array blocks is selected in the selected bank.

13. A volatile memory device according to claim 11 or 12, wherein when the volatile memory device is refreshed, the predecoders associated with the selected bank are activated, and the prodecoders associated with unselected ones of the banks are inactivated.

14. A method of refreshing information for a volatile memory device comprising,
- a plurality of memory cells for storing information which is necessary to be refreshed,
- a plurality of banks each having a plurality of cell array blocks each of which has a plurality of memory cells and a decoder portion for selecting the memory cells,
- an address buffer being supplied with an address signal, and
- a plurality of predecoders associated respectively with associated banks of said plurality of banks, for being supplied with an output signal from said address buffer and supplying predecoded signals to said associated banks:
- said method comprising steps of, when the volatile memory device is refreshed, activating the predecoder associated with one of said banks which is selected; simultaneously selecting a plurality of cell array blocks in the selected bank; and inactivating the predecoders associated with the banks which are unselected.

15. A method of refreshing information for a volatile memory device according to claim 14, wherein;
- said decoder portion has block decoders for selecting the cell array block and word decoders for selecting word line connected to the memory cells, and
- wherein said block decoders are supplied with the predecoded signals from associated predecoders, and that when the associated predecoders are inactivated, said block decoders are supplied with predecoded signals in an unselected state, and when the associated predecoders are activated, said block decoders are supplied with predecoded signals according to the address signal,
- and when the volatile memory device is refreshed, plural ones of said block decoders output selected decoded signals.

16. A method of refreshing information for a volatile memory device according to claim 15, wherein:
- said block decoders are supplied with predecoded signals in an unselected state and output unselected decoded signals when said predecoders are inactivated.

17. A method of refreshing information for a volatile memory device according to claim 15 or 16, wherein:
- said word decoders are supplied with predecoded signals from associated predecoders and decoded signals outputted from said block decoders,
- and wherein:
- the word decoders associated with the selected cell array blocks select a single word line in the selected cell array blocks depending on the supplied predecoded signals, and the word decoders associated with unselected cell array blocks are inactivated.

18. A method of refreshing information for a volatile memory device comprising,
- a plurality of memory cells for storing information which is necessary to be refreshed,
- a plurality of banks each having a plurality of cell array blocks each of which has a plurality of memory cells and a decoder region for selecting the memory cells,
- an address buffer being supplied with an address signal, and
- a plurality of predecoders associated respectively with said banks, for being supplied with an output signal from said address buffer and supplying predecoded signals to said associated banks,
- wherein said banks have a sense amplifier shared by adjacent ones of said cell array blocks, the sense amplifier is connected to bit lines of selected ones of said cell array blocks, and bit lines of unselected ones of said cell array blocks are disconnected from the sense amplifier;
- said method of refreshing comprising a step of simultaneously selecting, when the volatile memory device is refreshed, plural ones of said cell array blocks which are positioned so as not to share said sense amplifier in a selected one of said banks.

19. A method of refreshing information for a volatile memory device according to claim 18, wherein when the volatile memory device is in normal operation, a single one of the cell array blocks is selected in the selected bank.

20. A method of refreshing information for a volatile memory device according to claim 18 or 19, wherein when the volatile memory device is refreshed, the predecoders associated with the selected bank are activated, and the predecoders associated with unselected ones of the banks are inactivated.

21. A volatile memory device for refreshing information stored in a plurality of memory cells, comprising:
- a plurality of banks each having a plurality of cell array blocks each of which has a plurality of memory cells;
- an address buffer being supplied with an address signal; and
- a predecoder for being supplied with an output signal from said address buffer and supplying predecoded signals to said banks;
- wherein when the volatile memory device is refreshed, one of said banks is selected in response to said predecoded signals, and a plurality of cell array blocks in the selected bank are simultaneously selected, and the rest of said banks are inactivated.

22. A method of refreshing information for a volatile memory device comprising,
- a plurality of memory cells for storing information which is necessary to be refreshed,
- a plurality of banks each having a plurality of cell array blocks each of which has a plurality of memory cells,
- an address buffer being supplied with an address signal, and
- a predecoder for being supplied with an output signal from said address buffer and supplying predecoded signals to said banks:
- said method comprising steps of, when the volatile memory device is refreshed,
- selecting one of said banks in response to said predecoded signals;
- simultaneously selecting a plurality of cell array blocks in the selected bank; and
- inactivating the rest of said banks.

* * * * *